United States Patent
Erkens et al.

(10) Patent No.: US 10,001,540 B2
(45) Date of Patent: Jun. 19, 2018

(54) METHOD FOR ADAPTING THE SENSITIVITY OF A SENSOR SYSTEM

(71) Applicant: Microchip Technology Germany GmbH, Gilching (DE)

(72) Inventors: Holger Erkens, Aachen (DE); Claus Kaltner, Bergkirchen/Unterbachern (DE); Holger Steffens, Munich (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 586 days.

(21) Appl. No.: 14/351,633

(22) PCT Filed: Oct. 10, 2012

(86) PCT No.: PCT/EP2012/070096
§ 371 (c)(1),
(2) Date: Apr. 14, 2014

(87) PCT Pub. No.: WO2013/053780
PCT Pub. Date: Apr. 18, 2013

(65) Prior Publication Data
US 2015/0130478 A1    May 14, 2015

(30) Foreign Application Priority Data
Oct. 12, 2011 (DE) .......................... 10 2011 054 415

(51) Int. Cl.
| | |
|---|---|
| G01R 35/00 | (2006.01) |
| H03K 17/955 | (2006.01) |
| G01R 27/26 | (2006.01) |

(52) U.S. Cl.
CPC .......... *G01R 35/00* (2013.01); *G01R 27/2605* (2013.01); *H03K 17/955* (2013.01)

(58) Field of Classification Search
CPC .. G01R 27/2605; G01R 35/00; H03K 17/955; H03K 2217/94026; H03K 2217/96054
(Continued)

(56) References Cited

U.S. PATENT DOCUMENTS

| | | | |
|---|---|---|---|
| 4,652,819 A | 3/1987 | Kammerer | ............... 324/207.26 |
| 6,989,662 B2 | 1/2006 | Heger et al. | .................... 324/67 |

(Continued)

FOREIGN PATENT DOCUMENTS

| | | | | |
|---|---|---|---|---|
| CN | 101809415 A | 8/2010 | ............... | G01D 5/24 |
| DE | 3131490 A1 | 7/1983 | ........... | H03K 17/945 |

(Continued)

OTHER PUBLICATIONS

Espacenet Machine Translation DE10159336 (A1)—Dec. 5, 2002.*
(Continued)

*Primary Examiner* — Melissa Koval
*Assistant Examiner* — Courtney McDonnough
(74) *Attorney, Agent, or Firm* — Slayden Grubert Beard PLLC (57) ABSTRACT

Provided is a method for adapting the sensitivity of a sensor system, in particular of a capacitive sensor system, which provides a sensor signal, wherein
a first lower threshold value is adapted, if the sensor signal fulfills a first switching threshold criterion,
a first upper threshold value is adapted, if the sensor signal fulfills a second switching threshold criterion, and
at least one switching threshold value is adapted such that the switching threshold value has a predetermined first distance from the first upper threshold value and/or a predetermined second distance from the first lower threshold value.

22 Claims, 4 Drawing Sheets

(58) Field of Classification Search
USPC .................. 324/601, 658–690, 415–424
See application file for complete search history.

(56) References Cited

U.S. PATENT DOCUMENTS

| | | | |
|---|---|---|---|
| 7,202,674 B2 | 4/2007 | Nakano et al. | 324/661 |
| 2003/0194023 A1 | 10/2003 | Nakano | 375/317 |
| 2007/0032967 A1* | 2/2007 | Feen | H03K 17/955 702/47 |
| 2007/0176906 A1 | 8/2007 | Warren | 345/173 |
| 2008/0036473 A1 | 2/2008 | Jansson | 324/678 |
| 2008/0215296 A1 | 9/2008 | Craemer et al. | 702/189 |
| 2009/0289818 A1 | 11/2009 | Hou et al. | 341/33 |
| 2010/0289506 A1 | 11/2010 | Moon | 324/681 |
| 2011/0050633 A1* | 3/2011 | Lin | G06F 3/044 345/174 |
| 2011/0073384 A1 | 3/2011 | Osoinach et al. | 178/18.06 |
| 2011/0156800 A1* | 6/2011 | Lee | H03K 17/96 327/517 |
| 2011/0157074 A1 | 6/2011 | Lin et al. | 345/174 |
| 2011/0216016 A1 | 9/2011 | Rosener | 345/173 |
| 2012/0026121 A1* | 2/2012 | Unterreitmayer | G06F 1/1613 345/174 |

FOREIGN PATENT DOCUMENTS

| | | | | |
|---|---|---|---|---|
| DE | 19653648 A1 | | 6/1998 | ............ H03K 17/96 |
| DE | 10025662 A1 | | 12/2001 | ............ H03K 17/94 |
| DE | 10159336 A1 | * | 12/2002 | ............ G01D 3/02 |
| EP | 0132850 A1 | | 2/1985 | ........... H03K 17/945 |
| TW | 201014175 A | | 4/2010 | ............ H03K 17/96 |
| TW | 201122974 A | | 7/2011 | ............ G06F 3/044 |
| WO | 2011/098854 A1 | | 8/2011 | ............ G06F 3/033 |
| WO | 2013/053780 A1 | | 4/2013 | ........... H03K 17/955 |

OTHER PUBLICATIONS

Japanese Office Action, Application No. 2014535058, 7 pages, dated Aug. 3, 2016.
International Search Report and Written Opinion, Application No. PCT/EP2012/070096, 7 pages, dated Feb. 20, 2013.
European Office Action, Application No. 12784481.9, 3 pages, dated Jun. 29, 2015.
European Office Action, Application No. 12784481.9, 4 pages, dated Sep. 9, 2016.
European Office Action, Application No. 12784481.9, 3 pages, dated Feb. 28, 2017.
Chinese Office Action, Application No. 201280058031.1, 5 pages, dated Oct. 17, 2016.
Taiwan Office Action, Application No. 101137830, 5 pages, dated Dec. 21, 2016.
Chinese Office Action, Application No. 201280058031.1, 9 pages, dated May 11, 2016.
Taiwan Office Action, Application No. 101137830, 9 pages, dated Sep. 5, 2016.
German Office Action, Application No. 102011054415.1, 6 pages dated Aug. 2, 2012.
German Office Action, Application No. 102011054415.1, 3 pages dated Mar. 24, 2015.

* cited by examiner

METHOD FOR ADAPTING THE SENSITIVITY OF A SENSOR SYSTEM

CROSS-REFERENCE TO RELATED APPLICATIONS

This application is a U.S. National Stage Application of International Application No. PCT/EP2012/070096 filed Oct. 10, 2012, which designates the United States of America, and claims priority to DE Patent Application No. 10 2011 054 415.1 filed Oct. 12, 2011. The contents of which are hereby incorporated by reference in their entirety.

TECHNICAL FIELD

The invention relates to a method for adapting the sensitivity and for adjusting the sensibility, respectively, of a sensor system, in particular of a capacitive sensor system.

BACKGROUND

By means of generating and measuring electric alternating fields an approach of an object towards a sensor zone is measured in capacitive sensor systems. Derived from the measurement signal may be functions, for example switching functions of an electric device, in particular of an electric handheld device. This implies that the sensor signal, for activating a certain function, exceeds a predetermined switching threshold during the approach towards the sensor electrodes of the capacitive sensor system and at contacting the sensor electrodes, respectively.

Known in prior art are sensor systems and capacitive sensor systems, respectively, which work using predetermined and fixedly predefined, respectively, switching thresholds. The provision of fixed switching thresholds, however, has the disadvantage that each capacitive Sensor has a different sensibility and sensitivity, respectively, for example because variations in the production process result in that the switching threshold in each sensor is exceeded with a different amount of approach and with differently strong contact, respectively.

Furthermore, also the ambient conditions of an electric handheld device, in which a capacitive sensor is provided, may result in that the sensitivity of the capacitive sensor system depends on changing ambient conditions. For example, a grasping of an electric handheld device by a hand may result in that a switching threshold provided for the activation of the electric handheld device is exceeded, while during a grasping of a handheld device by a hand comprising a glove it may result in that the respective switching threshold is not exceeded. This has negative effects on the handling of the electric handheld device, because the handheld device during grasping with a hand without a glove reacts differently as compared to a grasping of the handheld device by a hand comprising a glove.

It is therefore desirable to provide a capacitive sensor system, which always has a substantially unchanging sensibility and sensitivity, respectively, independent of the external influences and ambient conditions, respectively.

In order to solve this problem it is known in conventional systems to adjust the switching threshold of a capacitive sensor system during an initialization phase, for example during switching on a handheld device, to such adjust the switching threshold to the ambient conditions existing during the initialization phase. However, in this case it is disadvantageous that the switching threshold only is set once, namely during switching on the handheld device. Admittedly this has the advantage that the switching threshold may be different after several initialization phases. On the other hand, this method, however, has the significant disadvantage that the switching threshold set during the initialization phase remains unchanged during the entire operation of the device so that the problems mentioned above only are avoided in part.

SUMMARY

Therefore, according to various embodiments, a method can be provided for adapting the sensitivity and sensibility, respectively, of a sensor system, in particular of a capacitive sensor system, which avoids the disadvantages mentioned above at least in part, with the objective that the sensor system and a handheld device in which the sensor system is provided, respectively, always feels equally sensitive and sensible for the user, independent of the ambient conditions of the sensor system.

A constituent part of the solution further is a sensor system, in particular a capacitive sensor system, which implements the method according to various embodiments for adapting the sensitivity of the sensor system. Provided as a solution for the goal mentioned also is an electric device, in particular an electric handheld device, which comprises at least one capacitive sensor system, which is designed to carry out the method according to various embodiments for adapting the sensitivity of the sensor system.

According to one embodiment, provided is a method for adapting the sensitivity of a sensor system, in particular of a capacitive sensor system, which provides a sensor signal, wherein a first lower threshold value is adapted, if the sensor signal fulfills a first switching threshold criterion, a first upper threshold value is adapted, if the sensor signal fulfills a second switching threshold criterion, and at least one switching threshold value is adapted such that the switching threshold value has a predetermined first distance from the first upper threshold value and/or a predetermined second distance from the first lower threshold value.

Advantageously, the first switching threshold criterion is fulfilled, when the sensor signal resides below the switching threshold value, and the second switching threshold criterion is fulfilled, when the sensor signal resides above the switching threshold value.

The switching threshold value may be adapted such that the switching threshold value in absolute value is smaller than the first upper threshold value and in absolute value is larger than the first lower threshold value.

It is advantageous, when during the adaptation of the first lower threshold value it is checked, whether the sensor signal resides above or below the first lower threshold value, the value of the first lower threshold value is decreased, if the sensor signal resides below the first lower threshold value, and the value of the first lower threshold value is increased, if the sensor signal resides above the first lower threshold value.

During the adaptation of the first lower threshold value it may be checked in addition, whether the sensor signal resides below a second lower threshold value, wherein the value of the first lower threshold value is decreased or increased, when the sensor signal in addition resides below the second lower threshold value.

Furthermore it may be advantageous, when
a first correction value is determined,
the first correction value is subtracted from the first lower threshold value, if the sensor signal resides below the first lower threshold value, and
the first correction value is added to the first lower threshold value, if the sensor signal resides above the first lower threshold value.

It has been proven to be advantageous, when
during adapting the first upper threshold value it is checked, whether the sensor signal resides above or below the first upper threshold value,
the value of the first upper threshold value is decreased, if the sensor signal resides below the first upper threshold value, and
the value of the first upper threshold value is increased, if the sensor signal resides above the first upper threshold.

During the adaptation of the first upper threshold value it may be checked in addition whether the sensor signal resides above a second upper threshold value, wherein the value of the first upper threshold value is decreased or increased, when the sensor signal in addition resides above the second upper threshold value.

It is advantageous, when
a predetermined second correction value is determined,
the second correction value is subtracted form the first upper threshold value, if the sensor signal resides below the first upper threshold value, and
the second correction value is added to the first upper threshold value, if the sensor signal resides above the first upper threshold value.

The first correction value and/or the second correction value at least may comprise one of
difference between sensor signal and first upper threshold value,
difference between sensor signal and first lower threshold value,
weighted difference between sensor signal and first upper threshold value
weighted difference between sensor signal and first lower threshold value, and
constant value After the adaptation of the first upper threshold value and/or the first lower threshold value and before the adaptation of the switching threshold value it may be checked, whether the difference between the first upper threshold value and the first lower threshold value or the difference between the second upper threshold value and the second lower threshold value in absolute value is larger or smaller than a predetermined minimum value, and a threshold adaption is carried out, if the difference in absolute value is smaller than the predetermined minimum value.

During the threshold value adaption the first upper threshold value may be set to the value of the sum of the first lower threshold value and the absolute value of the difference.

Prior to checking the sensor signal a starting condition may be checked and the method may be aborted, if the starting condition is not fulfilled.

Prior to checking the starting condition the starting condition may be adapted, wherein after checking the starting condition the starting condition is set to an initial value.

Prior to checking the sensor signal the first upper threshold value and the first lower threshold value each may be set to a predetermined initial value, if a predefined initial criterion is fulfilled.

It is advantageous when the switching threshold value is adapted according to the rule switching threshold value=first lower threshold value+(first upper threshold value−first lower threshold value)*sensitivity parameter wherein the sensitivity parameter preferably is in the range between 0 and 1.

Prior to the adaptation of the first lower threshold value and/or of the first upper threshold value in each case a predetermined adaptation criterion may be determined, wherein the first threshold values only then are adapted when the respective adaptation criterion is fulfilled.

The adaptation criterion may at least comprise one of
a predetermined number of consecutive measurement points from the sensor signal have a substantially unchanging measurement value, and
after a preferably escalated variation of the sensor signal a predetermined period of time has elapsed.

The first switching threshold criterion and the second switching threshold criterion may be fulfilled when the sensor signal resides below the upper threshold value.

The method according to various embodiments for adapting the sensitivity of a sensor system in particular is suited for capacitive sensor systems. The method according to various embodiments, however, also may be used for other sensor systems, which do not operate on a capacitive basis.

Further, provided by various embodiments is an electric device, in particular an electric handheld device, which at least has one capacitive sensor system, which is adapted to carry out the method according to various embodiments for adapting the sensitivity of the sensor system.

The electric device and the electric handheld device, respectively, may be a smart phone, a mobile radio device, a computer mouse, a device remote control, a digital camera, a game controller, a mobile mini-computer, a tablet-PC, a dictating device, a media player and the like.

BRIEF DESCRIPTION OF THE DRAWINGS

Details and characteristics of various embodiments result from the following description in connection with the drawing.

DETAILED DESCRIPTION

Adjusting a sensibility and sensitivity, respectively, of a sensor system means to adapt and change, respectively, at least one switching threshold value that has to be exceeded for a detection of a received signal of the sensor system. With a successful detection one (or several) system functions, for example of an electric handheld device, may be carried out. By means of adjusting and adapting, respectively, in particular by means of a dynamic setting and adaptation, respectively, of at least one switching threshold value the sensibility and sensitivity, respectively, of the sensor system substantially renders independent of the ambient characteristics of the sensor system. This has the advantage that a user always feels a handheld device and the sensor system, respectively, to be substantially equally sensible and sensitive, respectively.

Proposed in the following is a method, which allows for a virtually continuous and dynamic adaptation, respectively, of a switching threshold value in dependence on the current sensor signals of a sensor system, in particular for a capacitive sensor system, as well as on different further constraints. By means of the continuous and dynamic adaptation of a switching threshold value in particular it may be reacted on short-term and fast changing effects, which stem form the behavior of the user. The method according to various embodiments allows for compensating different influences onto the sensitivity and sensibility, respectively, of the device and the capacitive sensor system, respectively.

For example, such influences are:
- size of the hand grasping an electric handheld device (hand of a child, hand of an adult),
- use of protective covers, which cover an electric handheld device, and/or
- use of a glove at the hand clasping the handheld device.

Figure 1:
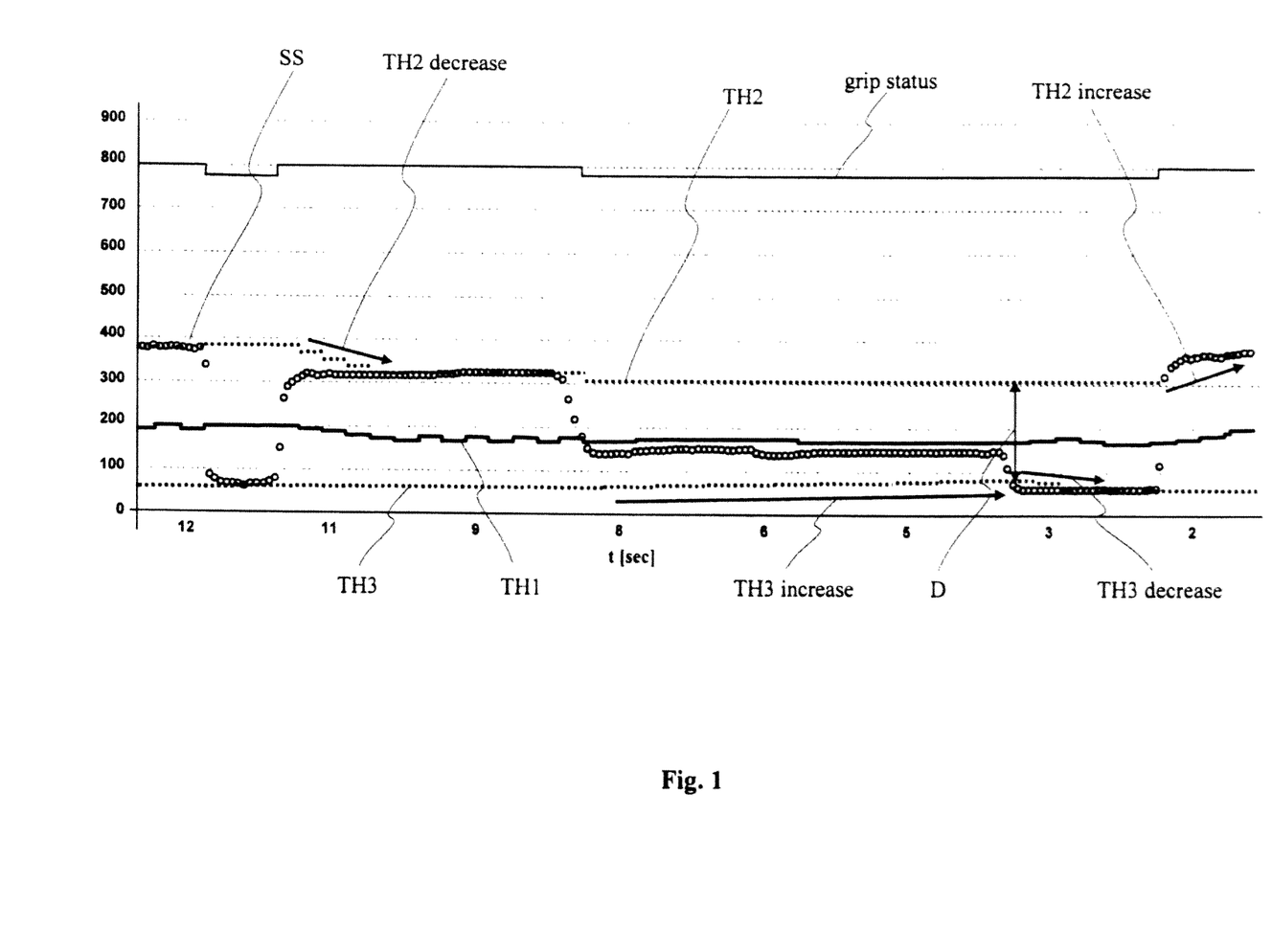
FIG. 1 shows a temporal course of a sensor signal as well as the substantial values for the dynamic adaptation of a switching threshold.

FIG. 1 shows the temporal course of a switching threshold value as well as the values relevant for the adaptation of the switching threshold value.

From the received and already sampled sensor signal SS, which is provided by the sensor system, all values required for the adaptation of the sensitivity of the sensor system are derived. This has the advantage that no special measures, in particular no hardware related measures, are required in order to be able to carry out an adaptation of the sensitivity of a sensor system. Therefore, the method according to various embodiments may be used for different capacitive sensor systems as well as also for sensor systems, which do not operate on a capacitive basis, without adaptations with respect to the hardware of the sensor system being required here.

The values derived from the received and sampled sensor signal SS, which are required for the adaptation of the sensitivity of the sensor system according to various embodiments, are:
- a first upper threshold value TH2: the first upper threshold value TH2 is a low-pass filtered representation of the sensor signal SS. The first upper threshold value TH2 preferably then is adapted, when the sensor signal SS resides above a switching threshold value TH1, as described below in more detail.
- a first lower threshold value TH3: the first lower threshold value TH3 is a low-pass filtered representation of the sensor signal SS. The first lower threshold value TH3 preferably then is adapted, when the sensor signal SS resides below the switching threshold value TH1, as also described below in more detail.
- at least one switching threshold value TH1: the switching threshold value TH1, for example, may represent a switching on threshold of the sensor system. The switching on threshold in the end determines the sensibility and sensitivity, respectively, of the sensor system. According to various embodiments the switching threshold value TH1 and the switching on threshold, respectively, is adjustable and adaptable, respectively, and preferably always resides between the first lower threshold value TH3 and the first upper threshold value TH2.

The method according to various embodiments in the following is described by way of example of a switching threshold value TH1 to be adjusted and to be adapted, respectively. However, according to various embodiments also several different switching threshold values may be adjusted and adapted, respectively. Also, it is feasible to provide further lower and upper threshold values, respectively, instead of only one first lower threshold value and one first upper threshold value, as, for example, is describe with respect to FIG. 4b.

According to various embodiments the first upper threshold value TH2 represents a maximum level of the received sensor signal SS commonly accomplished, while the first lower threshold value TH3 represents a commonly accomplished minimum level of the sensor signal SS. This way, by means of the first lower threshold value TH3 and the first upper threshold value TH2 the dynamic range of the sensor signal SS is described. The switching on threshold and the switching threshold value TH1, respectively, preferably always constitutes a fixed percentage of this dynamic range, so that the switching threshold value TH1 always resides between the first lower threshold value TH3 and the first upper threshold value TH2. The percentage mentioned also may be chosen depending on the dynamic range.

The adaptation of the switching threshold value TH1 shall be illustrated using an example:

Case 1: A user operates an electric handheld device without gloves and protective cover. In this case it has to be accounted for very high strokes of the sensor signal SS during grasping of the handheld device by a hand. The switching threshold value TH1 is set according to a desired sensitivity.

Case 2: The user puts a protective cover over the electric handheld device. Because the hand grasping the electric handheld device does not anymore reach that close to the sensor electrodes of the sensor device (because of the protective cover), the maximum achievable signal stroke of the sensor signal SS is less high than in case 1. Therefore, the switching threshold and the switching threshold value TH1, respectively, have to be decreased as compared to case 2, so that the user feels the electric handheld device and the sensor device, respectively, to be sensitive and sensible, respectively, in an unchanged manner.

By means of the two cases illustrated above the temporal course of the values shown in FIG. 1 is described in more detail:

In the temporal course shown in FIG. 2 some time periods are not shown for reasons of better clarity.

Until time t=12 the handheld device comprising the capacitive sensor device is grasped by a hand without glove, which results in a high signal level of the sensor signal SS. Since the received sensor signal SS resides above the switching threshold value TH1, the first upper threshold value TH2 is adapted. Since the first upper threshold value TH2 already is almost identical with the signal level of the sensor signal SS, the first threshold value TH2 almost is not adapted at all.

Between the points in time t=11 and t=9 a less strong grasping is detected, for example because the handheld device is provided with a protective cover or the user grasps the handheld device with a glove. The level of the received sensor signals indeed is lower as before the point in time t=12, but still resides above the switching threshold value TH1. The first upper threshold value TH2 now is adapted to the new maximum of the signal level of the sensor signal SS. The adaptation of the first upper threshold value TH2 in turn results in that also the switching threshold value TH1 is adapted and decreased, respectively. After a short amount of time the first upper threshold value TH2 and the switching threshold value TH1 are adapted. Since the switching threshold value TH1 was lowered, the capacitive sensor system is more sensitive than before the point in time t=12. A grasping of the handheld device such may be detected with the same sensitivity, also when the handheld device is provided with a protective cover or the handheld device is grasped using a glove.

Between the points in time t=8 and t=4 the received sensor signal SS resides below the switching threshold value TH1. This may be the case when the user grasps the handheld device only very lightly. Because the sensor signal SS resides below the switching threshold value TH1 the first lower threshold value TH3 slowly is adapted towards the signal level of the sensor signal SS.

Between the points in time t=3 and t=2 the handheld device is removed from the hand and is put onto a wooden plate, for example. In this case, the sensor signal SS falls below the first lower threshold value TH3, so that an adaptation of the lower first threshold value TH3 results in a decrease thereof and the first lower threshold value TH3 is adapted to the new minimum of the signal level of the sensor signal SS.

Below the point in time t=2 the electric handheld device again is strongly grasped by a hand without glove, which results in that the signal level of the sensor signal SS initially resides above a first upper threshold value TH2. This results in that the first upper threshold value TH2 is adapted to the new signal level of the sensor signal SS, i.e. is increased. Because of the new and increased, respectively, first upper threshold value TH2 also the switching threshold value TH1 increases, which results in a less sensitive and less sensible sensor system, respectively, wherein according to various embodiments no difference can be felt by the user with respect to the sensibility.

In order to allow for an optimum setting and adaptation, respectively, of the switching threshold value TH1 it is advantageous to adjust individually the rise times and the fall times of the first upper threshold value TH2 and of the first lower threshold value TH3, respectively. Therefore, the first upper threshold value and the first lower threshold value differ with respect to their characteristics.

The adaptation of the first lower threshold value TH3 preferably is carried out as follows:

The lower threshold value TH3 preferably represents the sensor signal SS, when the electric handheld device is not grasped by a hand. Since the signal level of the sensor signal SS in a non-grasped handheld device hardly changes it is advantageous to adapt the first lower threshold value TH3 slower than the first upper threshold value TH2. Since a rise of the first lower threshold value TH3 in most cases is a result of human influence since the device, for example, resides very loose in and on the hand, respectively, the human influence, however, not is desired, the first lower threshold value TH3 only shall rise very slowly and only very slowly shall be adapted to the minimum of the signal level of the sensor signal SS. Conversely, it is advantageous when the first lower threshold value TH3 decreases faster than it increases because, if the undesired rise of the first lower threshold value TH3 has taken place, the first lower threshold value TH3 quickly shall again fall to the initial value.

The following approach is advantageous for the setting and adaptation, respectively, of the first upper threshold value TH2:

The first upper threshold value TH2 preferably forms the maximum level of the sensor signal SS, which is accomplished, when the electric handheld device is grasped by a hand. Since this maximum level depending on the ambient conditions of the sensor signal SS (handheld device with or without protective cover, grasping of the handheld device with or without gloves, size of the hand, strength by which the handheld device is grasped) is different, it is advantageous, when the first upper threshold value TH2 is adapted efficiently to the current achievable maximum level of the sensor signal SS. Again it is advantageous in this case, when the rise of the first upper threshold value TH2 is faster than its fall. The fall of the first upper threshold value TH2 therefore shall be slower to reduce the influence of an electric device lying in the hand loosely. The "lying in the hand loosely" may be put on a level with a user of the handheld device who consciously tries to change and influence, respectively, the characteristics of the sensor system.

Advantageous variants for the adaptation of the first upper threshold value TH2 and of the first lower threshold value TH3 have been suggested above. Of course, also other variants may be used for the adaptation. In particular it is also feasible that the rise times and the fall times of the first upper threshold value TH2 and of the first lower threshold value TH3 are chosen to be equal.

Since no hardware related adaptations of the sensor systems are required according to various embodiments, the method according to various embodiments for adapting the sensitivity of a sensor system may be combined with different sensor systems, in particular with different capacitive sensor systems.

Figure 2A:
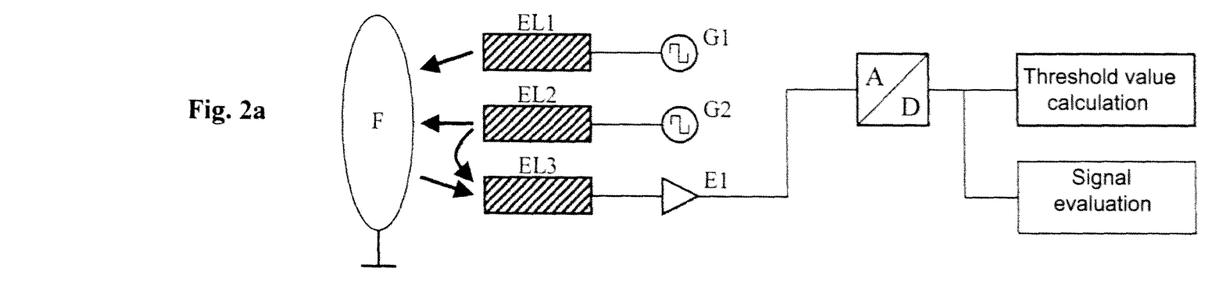
FIGS. 2a to 2c show three examples of a capacitive sensor system, which have implemented the method for adapting the sensitivity of the sensor system.
Figure 2B:
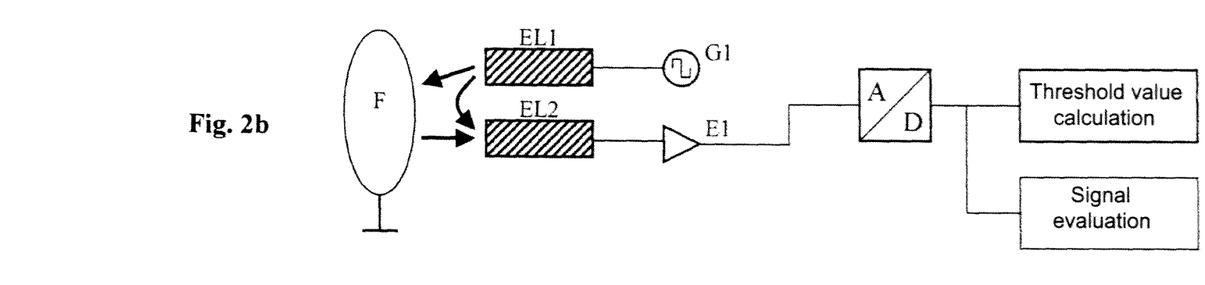
Figure 2C:
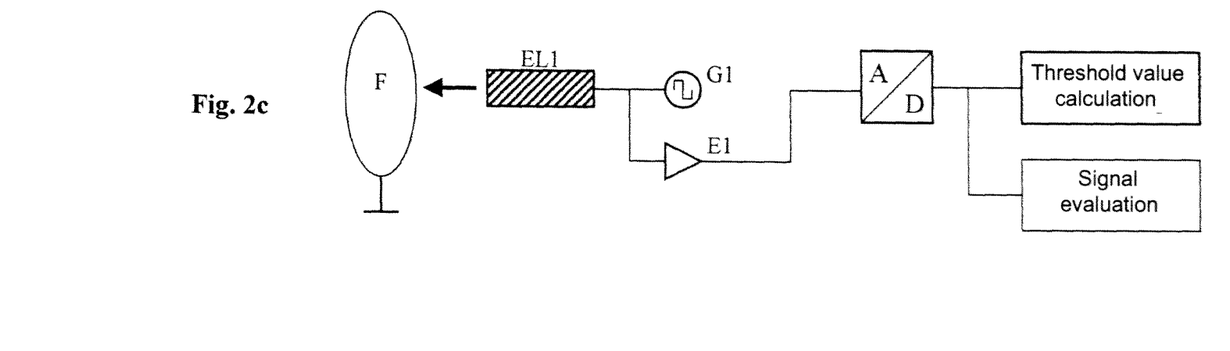

FIGS. 2a to 2c show three possible variants of a capacitive sensor system, in which the method according to various embodiments for adapting the sensitivity of the sensor system may be used and implemented, respectively.

The capacitive sensor system shown in FIG. 2a comprises three electrodes EL1, EL2 and EL3, from which two electrodes EL2 and EL3 are arranged closely adjacent to each other. The electrodes EL2 and EL3 therefore have a certain basic coupling. The electrode EL1 is arranged spaced from EL2 and EL3, so that the basic coupling between the electrode EL1 and the electrodes EL2, EL3 is negligible small. The electrode EL1 is loaded with a first generator signal, which is provided by a first signal generator G1. The electrode EL2 is loaded with a second generator signal, which is provided by a second signal generator G2.

Provided that a grasping of a handheld device shall be detected with the sensor system shown in FIG. 2a the second generator signal preferably has equal phase with respect to the first generator signal. If an approach of a hand shall be detected, the second generator signal preferably is shifted in phase, in particular opposite in phase with respect to the first generator signal.

FIG. 2b shows a capacitive sensor system comprising two sensor electrodes EL1 and EL2. In dependence on the sensor method to be used the electrodes may be arranged closely side-by-side or spaced farther from each other. The first electrode EL1 is operated as a transmitting electrode, wherein this electrode is coupled with a signal generator for loading the first electrode EL1 with a generator signal. The electrode EL2 is operated as a receiving electrode, into which couples the electric alternating field emitted from the transmitting electrode EL1.

FIG. 2c shows a capacitive sensor comprising only one sensor electrode EL1. This sensor system also is called a "loading sensor system", which is adapted to detect the capacitive load at the sensor electrode EL1.

The sensor electrode EL1 here at the same time is transmitting electrode and receiving electrode.

In all three sensor systems shown in FIGS. 2a to 2c an electric signal is tapped at the receiving electrode and is fed to an amplification device E1. The signal provided by the amplification device E1 is sampled and digitized, respectively, by means of an analog to digital converter A/D. The sampled and digitized, respectively, signal is fed to a threshold value calculation and if applicable to a signal evaluation. The threshold value calculation is carried out following the method according to various embodiments as is described in the following in more detail with respect to FIG. 3.

In the capacitive sensor systems shown in FIGS. 2a to 3c the threshold value calculation is carried out after an analog to digital conversion. Of course, the threshold value calculation also may be realized in an analog manner.

Figure 3:
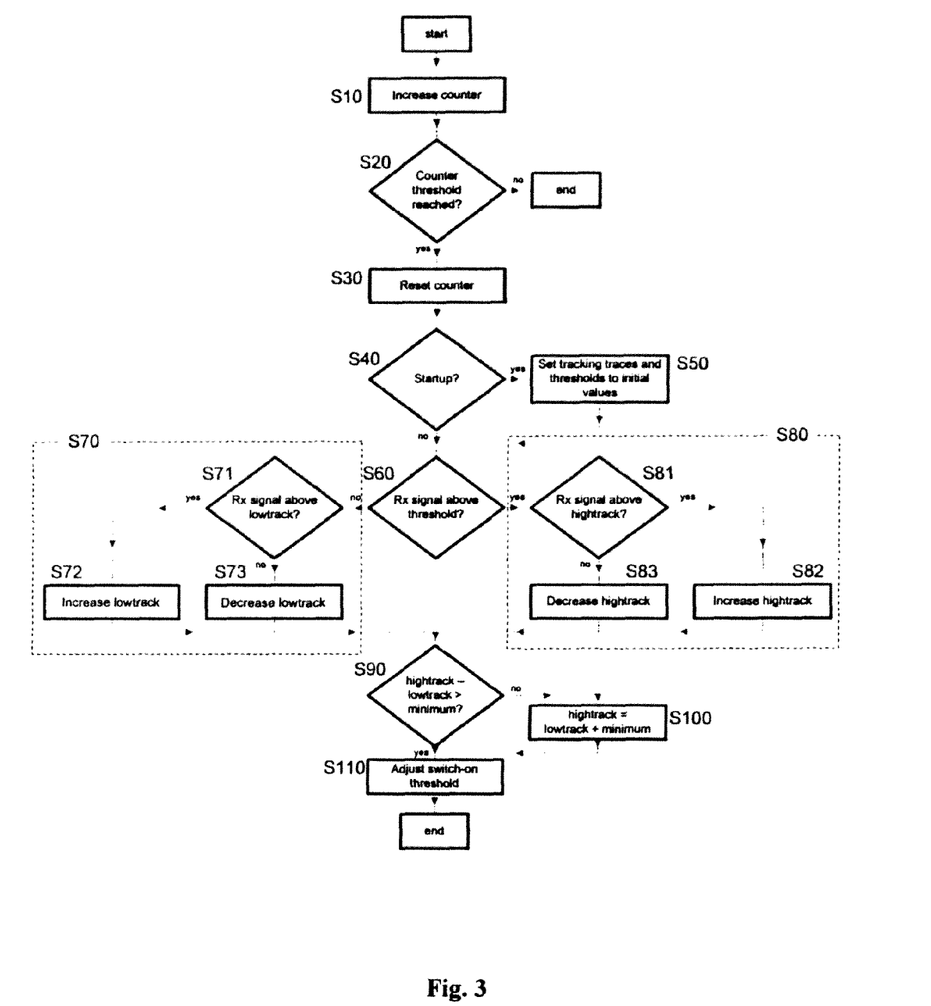
FIG. 3 shows a flowchart of the method according to an embodiment for adapting the sensitivity of a sensor system.

FIG. 3 shows a block diagram and flowchart, respectively, of a method according to an embodiment for adapting the sensitivity of a sensor system.

The method steps are carried out following each measurement, which is carried out with a repetition rate of approximately 5 to 20 Hz. However, in a specific embodiment the method steps also may be carried out after a predetermined number of realized measurements, so that the current consumption, for example of an electric handheld device, may be reduced.

At the start of the method a starting condition is checked by means of the two first steps S10 and S20, wherein the starting condition is adapted in the first step S10 and is evaluated in the second step S20. As an example, the starting condition may comprise a counter value, which has to be reached in order that the successive steps S30-S110 of the method are carried out. When a counter value is used a counter is incremented after the start of the method in step S10 and in step S20 it is checked, whether the counter value has reached a predetermined final value.

When the counter value not yet has reached the predetermined final value the method ends. The method then is started again after the next measurement. The incremented counter value is stored in a memory device, so that it is again available at the next start of the method according to various embodiments.

When the counter value reaches the predetermined final value the method is continued with step S30 by resetting the counter to its initial value. Providing the method steps S10 and S20 has the advantage that after each measurement value detection and after each measurement, respectively, not the entire method is run through, so that the average time of activity of the microcontroller executing the method preferably is low. This is of high importance in particular in battery and accumulator driven devices, because long lasting periods of activity of the microcontroller unnecessarily increase the current consumption. For example, a MSP430 microcontroller in active state consumes approximately 3 mA, while a capacitive sensors system, which is provided for approach detection, should have an average current consumption preferably in the lower µA range. As long as the current consumption only is of minor importance, the method also may be carried out without the steps S10, S20 and S30.

It is evaluated in the following step S40 whether the current run of the method is the first run after system start. If this is the case, the method is continued with method step S50, wherein the upper threshold value TH2 and the lower threshold value TH3 each are set to a predetermined initial value. The switching threshold value TH1 is set in step S110 and in step S50 does not have to be initialized additionally.

Following the initialization of the lower and upper threshold value, respectively, or when the current method run not is the first run of the method, the method is continued with step S60. In step S60 it now is checked, whether the sensor signal and the measurement signal, respectively, resides below or above the switching threshold value. When the measurement signal resides below the switching threshold value, the method is continued with step S70. Otherwise, the method is continued with step 80.

In step S70 the lower threshold value TH3 is adapted, in step S80 the upper threshold value TH2 is adapted. The distinction S60, whether the measurement signal resides below or above the switching threshold value substantially serves the fact that the variation of the sensitivity of the sensor system in each case only then is carried out, when this is justified by the respective influence (for example in consequence of a capacitive ambient condition).

As described with respect to FIG. 1, for example, the upper threshold value only then is adapted, when the measurement signal resides above the switching threshold value. As also described with respect to FIG. 1 the upper threshold value TH2 shall represent the current maximum of the signal level and the lower threshold value TH3 shall represent the current minimum of the signal level. Therefore it is advantageous to only adapt the upper threshold value TH3 in the case when the level of the measurement signal is close to the achievable maximum of the measurement signal, i.e. is above the switching threshold value TH1. Conversely it is therefore reasonable to adapt the lower threshold value TH3 only then when the level of the measurement signal is close to the achievable minimum, i.e. is below the switching threshold value TH1.

As aforesaid, in step S60 the switching threshold value TH1 was used as a decision criterion. However, it is also feasible to use another decision criterion instead of the switching threshold value TH1. In step S70 several sub-steps S71, S72 and S73 are executed before the method is continued with step S90. At first it is checked in step S71, whether the measurement signal and the sensor signal, respectively, resides above the lower threshold value TH3. If this is the case the lower threshold value TH3 is increased in step S73, so that the lower threshold value approximates the minimum of the signal level. Alternatively, when also the measurement signal and the sensor signal, respectively, resides below the lower threshold value TH3, the lower threshold value TH3 is decreased, so that in this case again the lower threshold value TH3 approximates the minimum of the signal level of the sensor signal.

In step S80, which comprises the sub-steps S81, S82 and S83 the upper threshold value TH2 is adapted, if it has been determined in step S60 that the measurement signal is above the switching threshold value TH1. As a start, it is checked in step S81, whether the measurement signal and the sensor signal, respectively, resides above the upper threshold value TH2. When this is the case, the upper threshold value TH2 is increased, so that the upper threshold value TH2 approximates the maximum level of the sensor signal. Alternatively, when the sensor signal resides below the upper threshold value TH2, the upper threshold value TH2 is decreased, so that in this case also the upper threshold value TH2 approximates the maximum level of the sensor signal.

Therefore, by means of the steps S70 and S80 the upper threshold value TH2 and the lower threshold value TH3 slowly approximate the maximum level and the minimum level, respectively, of the sensor signal. As already described with respect to FIG. 1 it is advantageous, to adjust the rise times and the fall times, respectively, of the upper and the lower threshold value, respectively, separately. By means of adjusting the respective rise times and fall times, respectively, it is caused that the upper and lower threshold value, respectively, approximates the maximum level and the minimum level, respectively, of the sensor signal with a certain delay.

A respective delay therefore is advantageous, because a very quick succeeding upper threshold value and lower threshold value, respectively, results in that also the switching threshold value continuously changes, which may result in that the electric handheld device may act very different in very short intervals with respect to the sensitivity. Larger delays, however, have the advantage that a uniform impression is ensured with respect to the sensitivity of the sensor. However, delays that are too large have the disadvantage that the capacitive sensor system only reacts very slowly with respect to changing ambient conditions. Therefore, the delays should be adjusted respectively in particular in dependence on the concrete requirements for the transient behavior.

For adapting the delay the two assumptions mentioned in the following may be provided:

1. Time-discrete low-pass filter of first order: Here the difference between the measurement signal and the respective threshold value may be determined and weighted. The weighted difference then may be added to the respective threshold value, when the measurement signal resides above the respective threshold value, or may be subtracted from the respective threshold value, when the measurement signal resides below the respective threshold value.

2. Time-discrete non-linear integrator: Herewith a constant may be added to the respective threshold value, when the measurement signal resides above the respective threshold value, or a constant may be subtracted from the respective threshold value, when the measurement signal resides below the respective threshold value.

The time-discrete low-pass filter of first order in general is more precise with small time constants, while the time-discrete, non-linear integrator is more precise with large time constants. Independent thereof the second variant, i.e. a time-discrete, non-linear integrator is advantageous with respect to the size of the program code as well as the processing time, which in particular is an advantage in devices operated by battery and accumulator, Respectively, when the current consumption has to be considered.

With interfering influences and with interfering signals, respectively, which can be detected, it may be advantageous not to execute the steps S70 and S80, respectively, or not to execute them in each case. By means of that it is avoided that an adaptation of the threshold values induced by interfering influences is carried out. In another embodiment it may be provided for, to correct the measurement signal from the interfering signals, before the steps S70 to S80 are carried out.

After the lower threshold value is adapted in step S70 and the upper threshold value is adapted in step S80, respectively, the method is continued in step S90. In step S90 it is checked, whether the dynamic range of the measurement signal represented by the upper threshold value TH2 and the lower threshold value TH3 falls below a predetermined minimum value. For example, this may be carried out in that it is checked, whether the difference between the upper threshold value and the lower threshold value falls below a predetermined minimum value.

When the dynamic range defined by the upper threshold value and the lower threshold value falls below a predetermined minimum value, then in step S100 the minimum dynamic range defined by the predetermined minimum value is recovered. In an embodiment this may be carried out in that the upper threshold value corresponds to the lower threshold value plus the minimum value. This way it is ensured that always a predetermined minimum distance is present between the lower and the upper threshold value.

By means of this procedure a maximum sensitivity of the sensor system is defined, which may not be exceeded. Without this measure it would be possible to lower the switching threshold value very close towards the lower threshold value. In this case the switching threshold value could also be exceeded when the electric device comprising the capacitive sensor device only resides on a table and not is grasped by a hand. As a result of the minimum distance between the lower threshold value and the upper threshold value to be complied with the switching threshold value also only may fall to a predetermined level. Erratic activations on the basis of a too high sensitivity of the sensor system may be avoided in this manner.

In the last step S110 finally the switching threshold value is adapted.

The adaptation of the switching threshold value may be carried out according to the following rule:

switching threshold value=lower threshold value+
(upper threshold value−lower threshold value)
*sensitivity parameter.

The sensitivity parameter is chosen from the range of values between 0 and 1, wherein larger values render the sensor system less sensitive, because a higher signal level of the measurement signal is required to exceed the switching threshold value.

In addition to the method described with respect to FIG. 3 yet further measures may be provided for and may be implemented, respectively. As described with respect to FIG. 1 the upper threshold value and the lower threshold value describe the currently achievable upper extreme and the currently achievable lower extreme, respectively, of the dynamic range of the sensor signal. Thereby it is advantageous, when only the respective extreme values are used for the adaptation and modification, respectively, of the upper threshold value and of the lower threshold value, respectively. In principle, however, an evaluation of the current signal level is not feasible with respect to whether it currently represents a maximum or a minimum value. With the help of suitable strategies, however, it may be determined, whether the respective signal level likely is an extreme value.

The additional measures suggested in the following are based on the usual behavior of the capacitive sensor. Commonly, the measurement signal and the sensor signal, respectively, for example, changes during the grasping of for example a handheld device and then is almost constant at the achievable extreme value over a certain period of time. The following strategies may be derived from this behavior:

1. The respective threshold values are adapted only then, when a predetermined number of subsequent measurement points from the sensor signal have a substantially unchanging measurement value. From this it may be concluded that the action of the grasping of the handheld device has ended and now a constant extreme value exists.

2. When a change of the signal of the sensor signal, which for example is caused by clasping or releasing the handheld device comprising the sensor system, is detected, then the adaptation of the respective threshold value is suspended for a predetermined period of time. By means of that and in an advantageous manner the transition period in which the signal change takes place is excluded from the threshold value adjustment.

Both above described additional measures may be realized and implemented, respectively, as additional query steps in step S70 and step S80, respectively.

Furthermore it may be advantageous to realize and implement, respectively, die above described additional measures in addition or alternatively to the query of the counter value in step S20.

Figure 4:
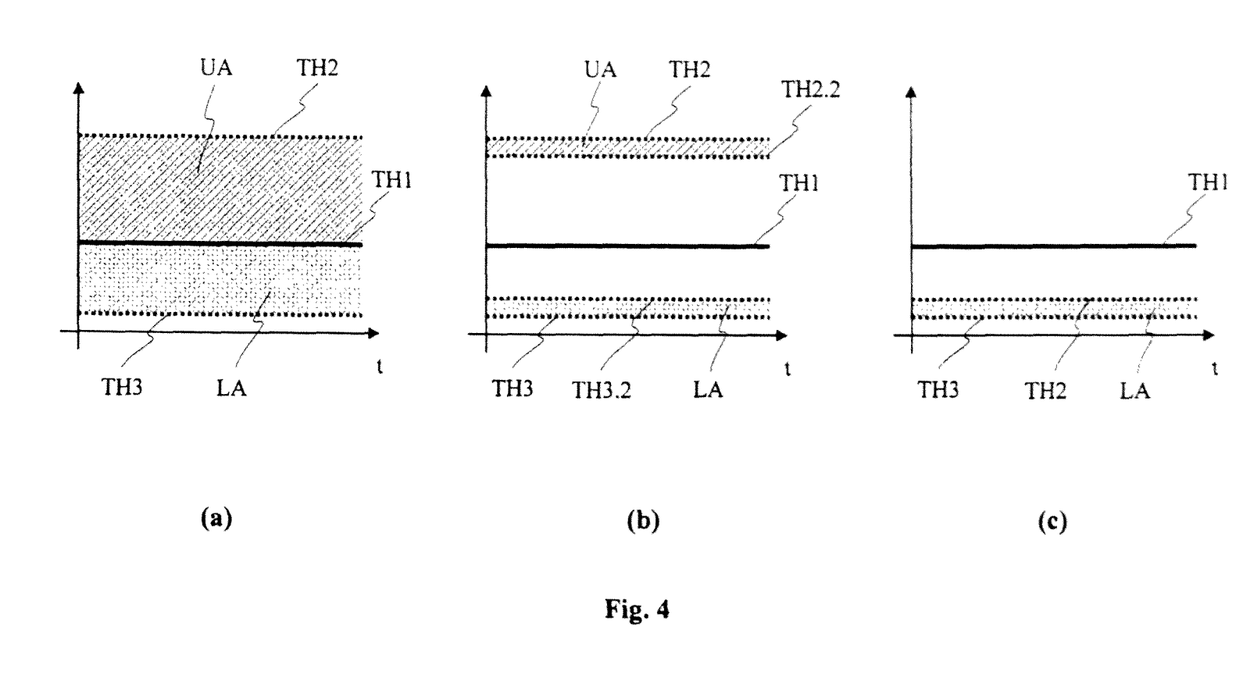
FIGS. 4a to 4c show different measurement areas for using the method according to an embodiment.

FIG. 4 shows three variants of a method according to various embodiments for adapting the sensitivity of a sensor system.

FIG. 4(a) corresponds to the method described with respect to FIG. 3 comprising a switching threshold value TH1, an upper threshold value TH2 and a lower threshold value TH3. When the sensor signal and the measurement signal, respectively, is in the range UA between the switching threshold value TH1 and the upper threshold value TH2, the upper threshold value TH2 is adapted. When the sensor signal and the measurement signal, respectively, is in the range LA between the switching threshold value TH1 and the lower threshold value TH3, the lower threshold value TH3 is adapted.

FIG. 4(b) shows a variant of the method according to an embodiment in which a second upper threshold value TH2.2 and a second lower threshold value TH3.2 are provided for in addition to the upper threshold value TH2 and the lower threshold value TH3. The second upper threshold value TH2.2 resides below the upper threshold value TH2. The second lower threshold value TH3.2 resides above the lower threshold value TH3.

In the variant shown in FIG. 4(b) the lower threshold value TH3 only then is adapted, when the measurement signal and the sensor signal, respectively, is in the range between the lower threshold value TH3 and the second lower threshold value TH3.2. Correspondingly, also the upper threshold value TH2 only then is adapted, when the sensor signal is in the range between the upper threshold value TH2 and the second upper threshold value TH2.2. Of course, during the adaptation of the lower threshold value TH3 as well as of the upper threshold value TH2 also the respective second threshold values, namely the second lower threshold value TH3.2 and the second upper threshold value TH2.2 have to be adapted correspondingly.

The distance between the lower threshold value TH3 and the second lower threshold value TH3.2 may be chosen depending on the distance of the lower threshold value TH3 from the partial threshold value TH1. For example, the distance between the threshold value TH3 and TH3.2. and between TH2 and THt2.2, respectively, may be chosen to be larger with a larger distance of the respective threshold value TH3 and TH2, respectively, from the switching threshold value TH1 than with a smaller distance from the switching threshold value TH1.

Shown in FIG. 4(c) is a specific variant of the method according to an embodiment in which only the lower threshold value TH3 is adapted, wherein the upper threshold value TH2 resides below the switching threshold value TH1 and thereby may constitute a range together with the lower threshold value TH3, wherein the lower threshold value TH3 only then is adapted, when the sensor signal exists in this range. Since with the method shown in FIG. 4(c) only the information counts when the handheld device not is grasped, the method shown in FIG. 4(c) in particular may be used for compensating fluctuations in production.

The method according to various embodiments in detail and in particular has the following advantages:

compensation of the differing received signal strengths caused by fluctuations in production, ageing or the like. These may be compensated by means of a threshold value that is adapting accordingly.

compensation of certain environmental influences, for example humidity, dirt or temperature. Again, the switching threshold value here adapts according to the achievable maximum signal travel.

compensation of device modifications by the user, for example when an electric handheld device is provided with a protective cover.

compensation of further changes in the environment of the handheld device, for example when a user wears gloves.

compensation of differently sized hands, for example a hand of a child or of an adult.

The above mentioned electric handheld device, for example, may be a smart phone, a mobile radio device, a computer mouse, a device remote control, a digital camera, a game controller, a mobile mini-computer, a tablet-PC, a dictating device, a media player and the like.

The invention claimed is:

1. A method for adapting the sensitivity of a sensor system which provides a sensor signal, wherein
a first lower threshold value is adapted, if the sensor signal fulfills a first switching threshold criterion,
a first upper threshold value is adapted, if the sensor signal fulfills a second switching threshold criterion, and
at least one switching threshold value is adapted such that the switching threshold value has at least one of a predetermined first distance from the first upper threshold value and a predetermined second distance from the first lower threshold value, the switching threshold value configured to define touch and release of the sensor system based on rising sensor signals and falling sensor signals.

2. The method of claim 1, wherein the first switching threshold criterion is fulfilled, when the sensor signal resides below the switching threshold value, and the second switching threshold criterion is fulfilled, when the sensor signal resides above the switching threshold value.

3. The method of claim 1, wherein the switching threshold value is adapted such that the switching threshold value in its absolute value is smaller than the first upper threshold value and in its absolute value is larger than the first lower threshold value.

4. The method of claim 1, wherein
during adapting of the first lower threshold value it is checked, whether the sensor signal resides above or below the first lower threshold value,
the value of the first lower threshold value is decreased, if the sensor signal resides below the first lower threshold value, and
the value of the first lower threshold value is increased, if the sensor signal resides above the first lower threshold value.

5. The method of claim 4, wherein during the adaptation of the first lower threshold value it is checked in addition, whether the sensor signal resides below a second lower threshold value, and wherein the value of the first lower threshold value is decreased or increased, when the sensor signal in addition resides below the second lower threshold value.

6. The method of claim 4, wherein
a predetermined first correction value is determined,
the first correction value is subtracted from the first lower threshold value, if the sensor signal resides below the first lower threshold value, and
the first correction value is added to the first lower threshold value, if the sensor signal resides above the first lower threshold value.

7. The method of claim 6, wherein
during adaptation of the first upper threshold value it is checked, whether the sensor signal resides above or below the first upper threshold value,
the value of the first upper threshold value is decreased, if the sensor signal resides below the first upper threshold value, and
the value of the first upper threshold value is increased, if the sensor signal resides above the first upper threshold value.

8. The method of claim 7, wherein during adaptation of the first upper threshold value it is checked in addition, whether the sensor signal resides above a second upper threshold value, and wherein the value of the first upper threshold value is decreased or increased, when the sensor signal in addition resides above the second upper threshold value.

9. The method of claim 7, wherein
a predetermined second correction value is determined,
the second correction value is subtracted from the first upper threshold value, if the sensor signal resides below the first upper threshold value, and
the second correction value is added to the first upper threshold value, if the sensor signal resides above the first upper threshold value.

10. The method of claim 6, wherein the first correction value and/or the second correction value comprises at least one of difference between sensor signal and first upper threshold value, difference between sensor signal and first lower threshold value, weighted difference between sensor signal and first upper threshold value, weighted difference between sensor signal and first lower threshold value, and constant value.

11. The method of claim 1, wherein after the adaptation of the first upper threshold value and/or of the first lower threshold value and before the adaptation of the switching threshold value it is checked, whether the difference between the first upper threshold value and the first lower threshold value or the difference between the second upper threshold value and the second lower threshold value in its absolute value is larger or smaller than a predetermined minimum value, and a threshold value adjustment is carried out, if the difference in its absolute value is smaller than the predetermined minimum value.

12. The method of claim 11, wherein during the threshold value adjustment the first upper threshold value is set to the value of the sum of the first lower threshold value and the absolute value of the difference.

13. The method of claim 1, wherein before checking the sensor signal a starting condition is checked and the method is aborted, if the starting condition is not fulfilled.

14. The method of claim 13, wherein before checking the starting condition the starting condition is adapted and wherein after checking the starting condition the starting condition is set to an initial value.

15. The method of claim 1, wherein before checking the sensor signal the first upper threshold value and the first lower threshold value each are set to a predetermined initial value, if a predefined initial criterion is fulfilled.

16. The method of claim 1, wherein the switching threshold value is adjusted according to the rule switching threshold value=first lower threshold value+(first upper threshold value−first lower threshold value)*sensitivity parameter wherein the sensitivity parameter preferably is in the range between 0 and 1.

17. The method of claim 1, wherein before the adaptation of the first lower threshold value and/or of the first upper threshold value in each case a predetermined adaptation criterion is determined, wherein the first threshold values only then are adapted, when the respective adaptation criterion is fulfilled.

18. The method of claim 17, wherein the adaptation criterion at least comprises one of
a predetermined number of consecutive measurement points from the sensor signal have a substantially unchanging measurement value, and
after a preferably escalating change of the sensor signal a predetermined period of time has elapsed.

19. The method of claim 1, wherein the first switching threshold criterion and the second switching threshold criterion are fulfilled, when the sensor signal resides below the upper threshold value.

20. A method for adapting the sensitivity of a capacitive sensor system comprising a transmitter electrode and a receiver electrode which provides a sensor signal, the method comprising:
feeding a signal to the transmitting electrode to generate an alternating electric field which is capacitively coupled into the receiving electrode;
evaluating the sensor signal received by the receiving electrode wherein
a first lower threshold value is adapted, if the sensor signal fulfills a first switching threshold criterion,
a first upper threshold value is adapted, if the sensor signal fulfills a second switching threshold criterion, and
at least one switching threshold value is adapted such that the switching threshold value has at least one of a predetermined first distance from the first upper threshold value and a predetermined second distance from the first lower threshold value, the switching threshold value configured to define touch and release of the capacitive sensor system based on rising sensor signals and falling sensor signals.

21. A capacitive sensor system comprising:
a transmitter electrode and a receiver electrode configured such that a signal is fed to the transmitting electrode to generate an alternating electric field which is capacitively coupled into the receiving electrode;
evaluation unit coupled with the receiving electrode and operable to evaluate the sensor signal received by the receiving electrode wherein the evaluation unit is further configured to adapt a first lower threshold value, if the sensor signal fulfills a first switching threshold criterion,
to adapt a first upper threshold value, if the sensor signal fulfills a second switching threshold criterion, and
to adapt at least one switching threshold value such that the switching threshold value has at least one of a predetermined first distance from the first upper threshold value and a predetermined second distance from the first lower threshold value, the switching threshold value configured to define touch and release of the capacitive sensor system based on rising sensor signals and falling sensor signals.

22. A handheld device comprising a capacitive sensor system according to claim 21.

* * * * *